(12) United States Patent
Park et al.

(10) Patent No.: US 7,256,080 B2
(45) Date of Patent: Aug. 14, 2007

(54) METHOD OF FABRICATING THIN FILM TRANSISTOR

(75) Inventors: Byoung-Keon Park, Suwon-si (KR);
Jin-Wook Seo, Suwon-si (KR);
Ki-Yong Lee, Suwon-si (KR);
Tae-Hoon Yang, Suwon-si (KR)

(73) Assignee: Samsung SDI Co., Ltd, Suwon-si (KR)

( * ) Notice: Subject to any disclaimer, the term of this patent is extended or adjusted under 35 U.S.C. 154(b) by 298 days.

(21) Appl. No.: 11/015,745

(22) Filed: Dec. 17, 2004

(65) Prior Publication Data
US 2006/0040434 A1 Feb. 23, 2006

(30) Foreign Application Priority Data
Aug. 23, 2004 (KR) .................. 10-2004-0066511

(51) Int. Cl.
*H01L 21/84* (2006.01)
(52) U.S. Cl. ...................... 438/166; 438/486
(58) Field of Classification Search ............... 438/166, 438/482, 486, 593, 795
See application file for complete search history.

(56) References Cited

U.S. PATENT DOCUMENTS

| | | | |
|---|---|---|---|
| 5,619,044 A * | 4/1997 | Makita et al. ................ 257/64 |
| 6,670,224 B2 * | 12/2003 | Lee et al. ................... 438/160 |
| 6,784,034 B1 * | 8/2004 | Choi ........................ 438/164 |
| 6,787,433 B2 * | 9/2004 | Mitani et al. ............... 438/479 |
| 6,812,081 B2 * | 11/2004 | Yamazaki et al. .......... 438/197 |

* cited by examiner

*Primary Examiner*—Tuan H. Nguyen
(74) *Attorney, Agent, or Firm*—Christie, Parker & Hale, LLP

(57) ABSTRACT

A method of fabricating a thin film transistor includes preparing an insulating substrate; forming a first amorphous silicon layer on the substrate; forming a diffusion barrier layer pattern on the first amorphous silicon layer; forming a second amorphous silicon layer over the whole surface of the substrate; forming a metal silicide layer on the second amorphous silicide layer; and heat-treating the substrate to form first and second polysilicon layers.

20 Claims, 5 Drawing Sheets

METHOD OF FABRICATING THIN FILM TRANSISTOR

CROSS-REFERENCE TO RELATED APPLICATION

This application claims priority to and the benefit of Korean Patent Application No. 10-2004-0066511, filed Aug. 23, 2004, the disclosure of which is hereby incorporated herein by reference in its entirety.

FIELD OF THE INVENTION

The present invention relates to a method of fabricating a thin film transistor and, more particularly, to a method of fabricating a thin film transistor including forming a first amorphous silicon layer on an insulating substrate, forming a diffusion barrier layer on the first amorphous silicon layer, forming a second amorphous silicon layer over the whole surface of the substrate, forming a metal silicide layer on the second amorphous silicon layer, heat-treating the substrate to crystallize predetermined regions of the first and second amorphous silicon layers using a metal induced crystallization (MIC) technique, crystallizing the remaining regions using a metal induced lateral crystallization (MILC) technique to form a semiconductor layer, and forming a gate insulating layer, a gate electrode, an interlayer insulator, and source/drain electrodes.

BACKGROUND OF THE INVENTION

In making a thin film transistor ("TFT") used in a display device, a semiconductor layer is formed such that an amorphous silicon layer is deposited on a transparent substrate made of glass or quartz and the amorphous silicon layer is subjected to a dehydrogenation treatment and is crystallized.

At this time, the semiconductor layer which constitutes a source, a drain and a channel area is formed by depositing an amorphous silicon layer on a transparent substrate made of a material such as glass using a chemical vapor deposition ("CVD") technique. The silicon layer deposited directly on the substrate using a CVD technique is an amorphous silicon layer which contains about 12% of hydrogen and thus has a low electron mobility, and when the amorphous silicon layer having such a low electron mobility is heat-treated and crystallized into a silicon layer of crystalloid structure having a high electron mobility, the silicon layer may be damaged since the hydrogen contained therein may explode. In order to prevent such a hydrogen explosion from occurring during crystallization, a dehydrogenation process is carried out. The dehydrogenation process is performed such that a heat-treatment step is performed in the furnace at a temperature of more than about 400° C. for tens of minutes to tens of hours. Then, the dehydrogenated amorphous silicon layer is subjected to a crystallization process.

The crystallization technique which crystallizes an amorphous silicon layer to form a polysilicon layer includes a solid phase crystallization technique and an excimer laser crystallization technique. The solid phase crystallization technique is one which heat-treats and crystallizes an amorphous silicon layer for several hours to tens of hours at a temperature less than about 700° C. which is a temperature that may transform the glass which forms the substrate of a display device on which the TFT is formed. The excimer laser crystallization process is one which scans an excimer laser to an amorphous silicon layer to be heated and crystallized at a high temperature for a very short time.

However, the solid phase crystallization technique has disadvantages in that a relatively lengthy processing time is required and the substrate is exposed to a high temperature for a long time and thus, the glass of the substrate may transform. The excimer laser crystallization technique also has disadvantages in that a high-priced laser device is needed and also, an extrusion may occur on a crystallized surface forming an undesirable interface characteristic between a semiconductor layer and a gate insulating layer.

SUMMARY OF THE INVENTION

In one embodiment of the present invention, a method of fabricating a thin film transistor (TFT) is provided including forming a first amorphous silicon layer on an insulating substrate, forming a diffusion barrier layer on the first amorphous silicon layer, forming a second amorphous silicon layer over the whole surface of the substrate, forming a metal silicide layer on the second amorphous silicon layer, heat-treating the substrate to crystallize predetermined regions of the first and second amorphous silicon layers using a metal induced crystallization (MIC) technique, crystallizing the remaining regions using a metal induced lateral crystallization (MILC) technique to form a semiconductor layer, and forming a gate insulating layer, a gate electrode, an interlayer insulator, and source/drain electrodes.

In order to achieve the object, the present invention provides a method of fabricating a thin film transistor, comprising: preparing an insulating substrate; forming a first amorphous silicon layer on the substrate; forming a diffusion barrier layer pattern on the first amorphous silicon layer; forming a second amorphous silicon layer over the whole surface of the substrate; forming a metal silicide layer on the second amorphous silicide layer; and heat-treating the substrate to form first and second polysilicon layers.

The method may further comprise, after heat-treating the substrate, etching the metal silicide layer and a region of the second amorphous silicon layer; removing the diffusion barrier layer pattern; patterning the first polysilicon layer and the second polysilicon layer in a region of the first amorphous layer to form a semiconductor layer; and sequentially forming a gate insulating layer, a gate electrode, an interlayer insulator, and source and drain electrodes over the substrate.

The method may further comprise, after heat-treating the substrate, etching the metal silicide layer and the first polysilicon layer; etching the diffusion barrier layer pattern to form a semiconductor layer; and sequentially forming a gate insulating layer, a gate electrode, an interlayer insulator, and source and drain electrodes over the substrate.

The method may further comprise, after heat-treating the substrate, etching the metal silicide layer and the second amorphous silicon layer region; etching the first amorphous silicon layer region to form a semiconductor layer and a first gate insulating layer; and sequentially forming a second gate insulating layer, a gate electrode, an interlayer insulator, and source and drain electrodes over the substrate.

The method may further comprise, after heat-treating the substrate, etching the metal silicide layer and the first polysilicon layer to form a first gate insulating layer and a semiconductor layer; and sequentially forming a second gate insulating layer, a gate electrode, an interlayer insulator, and source and drain electrodes over the substrate.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION

Figure 1A:
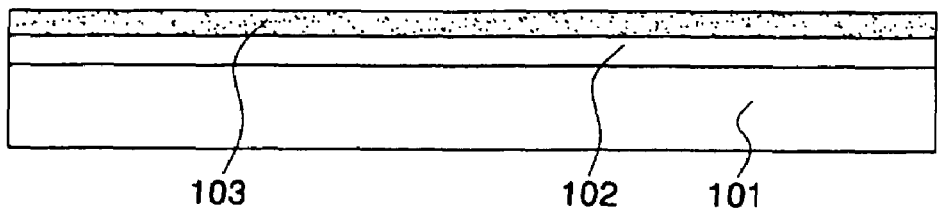
FIGS. 1a to 1c are cross-sectional views illustrating a process of crystallizing a semiconductor layer of a thin film transistor ("TFT") according to the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 1B:
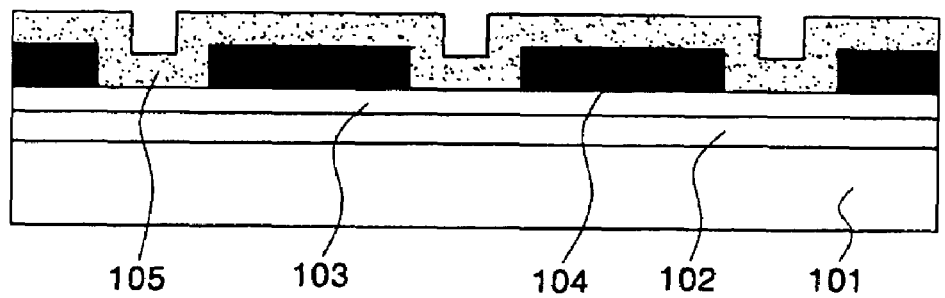
Figure 1C:
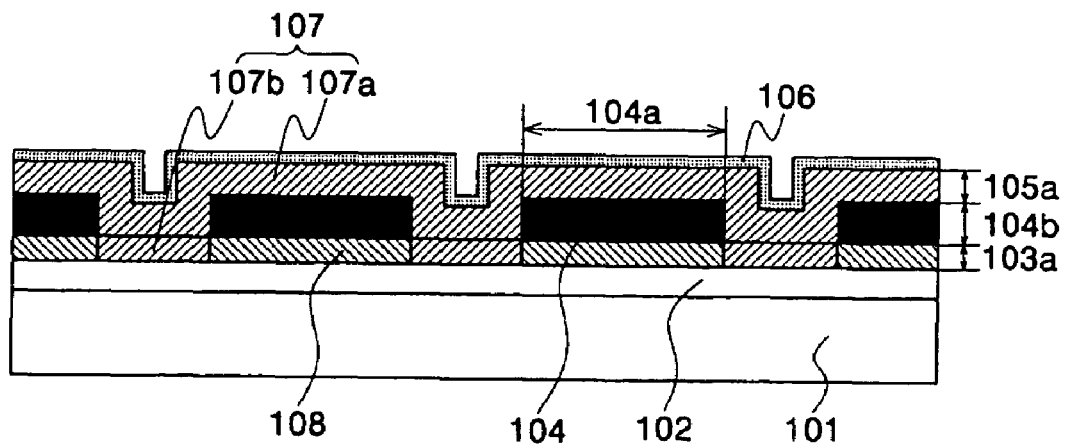

FIGS. 1a to 1c are cross-sectional views illustrating a process of crystallizing a semiconductor layer of a thin film transistor ("TFT") according to the present invention.

FIG. 1a is a cross-sectional view illustrating a process of forming a buffer layer on an insulating substrate and forming a first amorphous silicon layer on the buffer layer. As shown in FIG. 1a, a buffer layer 102 is formed on a transparent insulating substrate 101 made of a material such as plastic or glass. The buffer layer 102 serves to prevent water or impurities from being diffused on the substrate 101 and to control the heat transfer speed during crystallization, thereby improving semiconductor performance.

A first amorphous silicon layer 103 is formed on the buffer layer 102 using a physical vapor deposition ("PVD") technique or a chemical vapor deposition ("CVD") technique. Here, the first amorphous silicon layer 103 has a thickness from 200 Å to 1,000 Å, and preferably from 400 Å to 600 Å. This first amorphous silicon layer 103 later forms a semiconductor layer of a TFT.

The silicon layer deposited directly on the substrate using, for example, the CVD technique is an amorphous silicon layer which contains about 12% hydrogen and thus has a low electron mobility. An amorphous silicon layer having such a low electron mobility is heat-treated and crystallized into a silicon layer of crystalloid structure having a high electron mobility. However, the silicon layer may be damaged during the heat-treatment since hydrogen contained therein may explode. In order to prevent a hydrogen explosion from occurring during crystallization, a dehydrogenation process is carried out. The dehydrogenation process is performed by a heat-treatment step performed in a furnace at a temperature of more than about 400° C. for tens of minutes to tens of hours.

FIG. 1b is a cross-sectional view illustrating a process of forming a diffusion barrier layer pattern on the first amorphous silicon layer and forming a second amorphous silicon layer over the whole surface of the substrate. As shown in FIG. 1b, a diffusion barrier layer is formed on the substrate having the first amorphous silicon layer 103 and then patterned into a diffusion barrier layer pattern 104. At this time, the diffusion barrier layer pattern 104 is formed of a silicon oxide layer or a silicon nitride layer and has a single-layer structure or a multi-layer structure. The diffusion barrier layer pattern 104 serves to prevent metal induced crystallization ("MIC") of the first amorphous layer below the diffusion barrier layer pattern 104 and to prevent metal silicide from being diffused into the first amorphous silicon layer below the diffusion barrier layer pattern 104 while the amorphous silicon layer is crystallized in a later heat-treatment process.

Subsequently, a second amorphous silicon layer 105 is formed over the whole surface of the substrate 101 using a PVD technique or a CVD technique. Here, the second amorphous silicon layer 105 has a thickness of 500 Å to 1,500 Å. This is because the first amorphous silicon layer is formed to be as thick as a semiconductor layer of a TFT, but the second amorphous silicon layer should be formed to have enough thickness to prevent a metal catalyst from being diffused into the first amorphous silicon layer even though the crystallinity of the second amorphous silicon layer which is crystallized by a metal catalyst should be transferred to the first amorphous silicon layer when the first and second amorphous silicon layers are crystallized in a later crystallization process.

Next, FIG. 1c is a cross-sectional view illustrating a process of forming a metal silicide layer on the second amorphous silicon layer and heat-treating the substrate to form a first polysilicon layer and a second polysilicon layer. As shown in FIG. 1c, a metal catalyst of at least one of Ni, Pd, Ti, Ag, Au, Al, Sn, Sb, Cu, Co, Mo, Cr, Ru, Rh, Cd, and Pt is deposited on the substrate having the second amorphous silicon layer 105 and then removed to form a metal silicide layer 106 on the second amorphous silicon layer 105. Here, the metal layer is preferably formed to have a thickness of about 1 Å using a sputtering device. Since it is a thin layer, the density of the metal residue is low so that any leakage current from the semiconductor layer of the TFT is low.

Here, the metal silicide layer is preferably formed of a nickel silicide layer. This is because the nickel silicide layer has the best characteristic in crystallizing an amorphous silicon layer to a polysilicon layer.

Subsequently, the substrate having the first amorphous silicon layer, the diffusion barrier layer pattern, the second amorphous silicon layer, and the metal silicide layer is heat-treated at a temperature of from 400° C. to 1,300° C., preferably from 400° C. to 700° C., especially for a transparent insulating substrate made of, for example, glass.

By the heat treatment, the second amorphous silicon layer and a predetermined region of the first amorphous silicon layer are crystallized by a MIC technique due to the metal silicide layer formed on the second amorphous silicon layer to form a first polysilicon layer 107 comprising the crystallized second amorphous silicon layer 107a and a crystallized portion 107b of the first amorphous silicon layer. The crystallinity of the first polysilicon layer is then laterally transferred by a MILC technique to crystallize the remaining portion of the first amorphous silicon layer, thereby forming a second polysilicon layer 108.

At this time, when the substrate is heat-treated for crystallization, the diffusion barrier layer pattern serves to control the regions of the polysilicon layer crystallized by the MIC technique and the polysilicon layer crystallized by the MILC technique. That is, the width 104a and the thickness 104b of the diffusion barrier layer pattern and the interval between the diffusion barrier layers directly affect the region of the first amorphous silicon layer crystallized by the MIC technique and the region of the second amorphous silicon layer crystallized by the MILC technique. Also, the thickness 103a of the first amorphous silicon layer and the thickness of the second amorphous silicon layer directly affect the crystallized region.

The width of the diffusion barrier layer pattern is determined in consideration of the size of the semiconductor layer of a TFT, especially the longitudinal width of the semiconductor layer. This is because a semiconductor layer of a TFT is preferably comprised of the second polysilicon layer, i.e., the polysilicon layer crystallized by the MILC technique. Of course, there may be a case that the width of the diffusion barrier layer pattern is smaller or larger than that of the semiconductor layer, but when the width of the diffusion barrier layer pattern is identical to that of the semiconductor layer, the manufacturing process is simple, and the surface of the semiconductor layer contacting a gate insulating layer is not exposed, whereby it does not contact a material such as a photoresist which may cause contamination. Also, the diffusion barrier layer preferably is of a width such that the first amorphous silicon layer located below the diffusion barrier layer pattern is crystallized by the MILC technique to form the second polysilicon layer having less than one grain boundary, i.e., less than two grains. In general, the grain boundary of the semiconductor layer serves to prevent a movement of electrons and thus it is important to form as small a number of grain boundaries as possible. However, if it is impossible to completely prevent forming a grain boundary, it is also important to uniformly form the grain boundaries to thereby provide uniform electron mobility of the semiconductor layers formed on the substrate.

During the heat treatment process described above, the metal silicide in the metal silicide layer crystallizes the second amorphous silicon layer and also is crystallized into the first polysilicon layer by the MILC technique. At this time, the diffused metal silicide serves as a ground to increase a leakage current of the TFT. Thus, the diffusion barrier layer pattern is preferably sufficiently thick that the metal silicide is not diffused to the first amorphous silicon layer.

Preferably, the interval between the diffusion barrier layer patterns is identical to the interval between the semiconductor layers of the TFT and is sufficiently wide that the crystallinity of the first polysilicon layer can be significantly transferred since the second polysilicon layer formed below the diffusion barrier layer pattern forms one semiconductor layer.

Accordingly, the thickness of the first amorphous silicon layer, the thickness of the diffusion barrier layer pattern, the width of the diffusion barrier layer, the interval between the diffusion barrier layer patterns, and the thickness of the second amorphous silicon layer are appropriately adjusted such that the first amorphous silicon layer between the whole second amorphous silicon layer and the diffusion barrier layer pattern is crystallized into the first polysilicon layer by a MIC technique and the first amorphous silicon layer below the diffusion barrier layer is crystallized into the second polysilicon layer by the MILC technique, the metal silicide is not diffused to the second polysilicon layer, and the second polysilicon layer below the diffusion barrier layer pattern has less than one grain boundary.

Figure 2A:
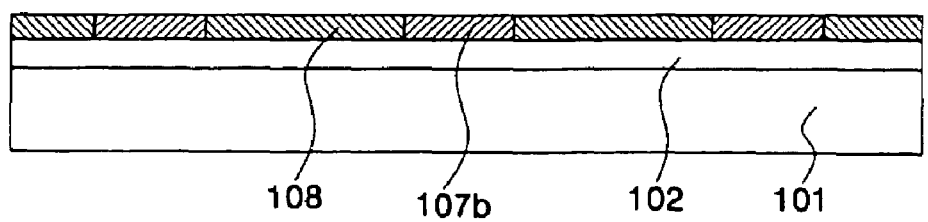
FIGS. 2a to 2c are cross-sectional views illustrating a first embodiment of a process of fabricating a TFT using the polysilicon layers crystallized according to the present invention.
Figure 2B:
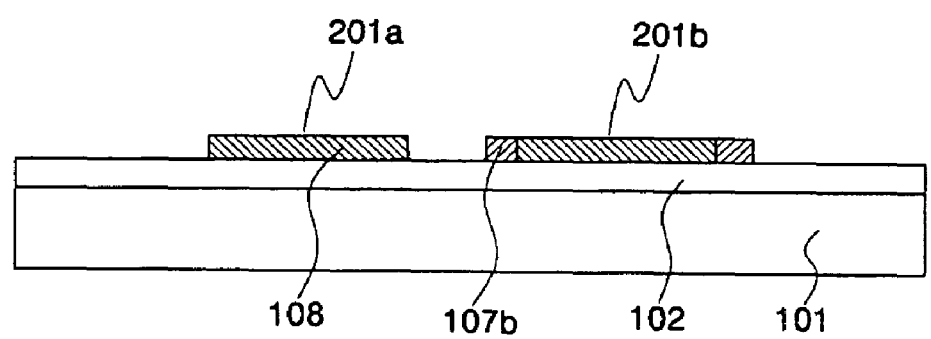
Figure 2C:
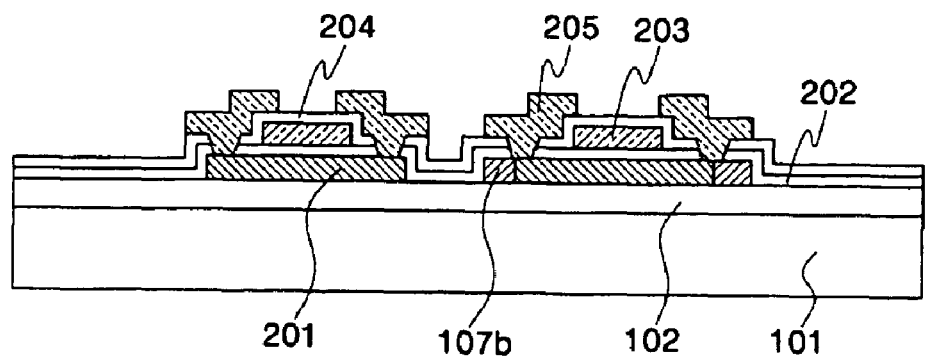

FIGS. 2a to 2c are cross-sectional view illustrating a first embodiment of a process of fabricating a TFT using the polysilicon layers crystallized according to the present invention.

FIG. 2a is a cross-sectional view illustrating a process of etching the metal silicide layer and the second amorphous silicon layer and removing the diffusion barrier layer pattern after forming the first and second polysilicon layers by the heat-treatment process. As shown in FIG. 2a, after the heat-treatment process is performed to form the first and second polysilicon layers, the metal silicide layer and the second amorphous silicon layer region are removed by using a wet-etching or a dry-etching technique. However, the first polysilicon layer and the second amorphous silicon layer of the first amorphous silicon layer region are not etched.

At this time, the first amorphous silicon layer region denotes the first crystallized amorphous silicon layer formed in FIG. 1a, and the second amorphous silicon layer region denotes the second crystallized amorphous silicon layer formed in FIG. 1b. As mentioned above, the first and second amorphous silicon layers are crystallized by a MIC technique and a MILC technique, respectively, to form the second polysilicon layer and the first polysilicon layer. Here, a predetermined region of the first amorphous silicon layer, the region between the diffusion barrier layer patterns, is crystallized into the first polysilicon layer, and the remainder of the first amorphous silicon layer is crystallized into the second amorphous silicon layer, and the second amorphous silicon layer is crystallized into the first polysilicon layer. Thus, in order to make this more clear, the first amorphous silicon layer region, the second amorphous silicon layer region, the first polysilicon layer, and the second polysilicon layer are separately described.

FIG. 2b is a cross-sectional view illustrating a process of patterning the first and second polysilicon layers in the first amorphous silicon layer region to form a semiconductor layer. As shown in FIG. 2b, the first amorphous silicon region which is crystallized into the first polysilicon layer 107b and the second polysilicon layer 108 is patterned to form semiconductor layers 201a and 201b.

At this time, in the semiconductor layer, the semiconductor layer 201a may be comprised of the second polysilicon layer, and the semiconductor layer 201b has its edge formed of the first polysilicon layer and the rest formed of the second polysilicon layer. Since the second polysilicon layer crystallized by the MILC technique shows excellent electrical characteristics, it is preferred that the semiconductor is made of only the second polysilicon layer.

FIG. 2c is a cross-sectional view illustrating a process of sequentially forming a gate insulating layer, a gate electrode, an interlayer insulator, and source and drain electrodes on the substrate having the semiconductor layer. As shown in FIG. 2c, a gate insulating layer 202 of a single- or a multi-layer structure formed of a silicon oxide layer or a silicon nitride layer is formed on the substrate on which the semiconductor layer is formed. Then, a gate electrode material layer is deposited over the whole surface of the substrate and patterned into a gate electrode 203. An interlayer insulator 204 of a single- or multi-layer structure formed of a silicon oxide layer or a silicon nitride layer is formed over the whole surface of the substrate. The interlayer insulator and the gate insulating layer are etched to form contact holes which expose predetermined regions of the semiconductor layer. A source/drain electrode material layer is deposited over the whole surface of the substrate and patterned into source and drain electrodes 205, thereby completing a TFT.

At this time, after forming the gate electrode, an ion doping process may be further performed using the gate electrode as a mask to define a source/drain region and a channel area.

Figure 3A:
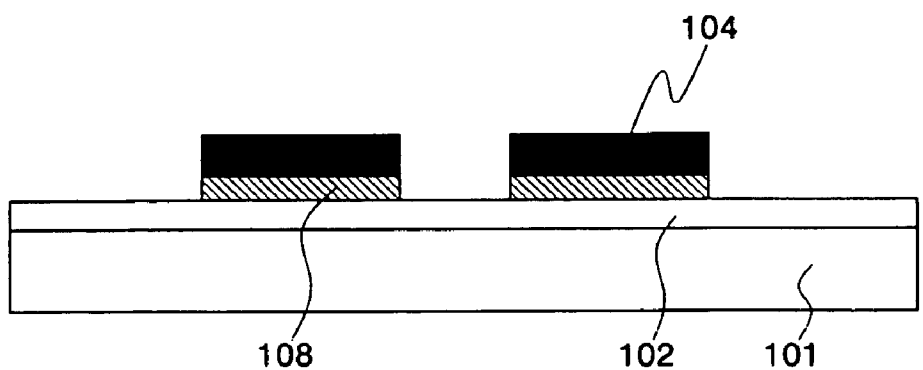
FIGS. 3a to 3c are cross-sectional views illustrating a second embodiment of a process of fabricating a TFT using the polysilicon layers crystallized according to the present invention.
Figure 3B:
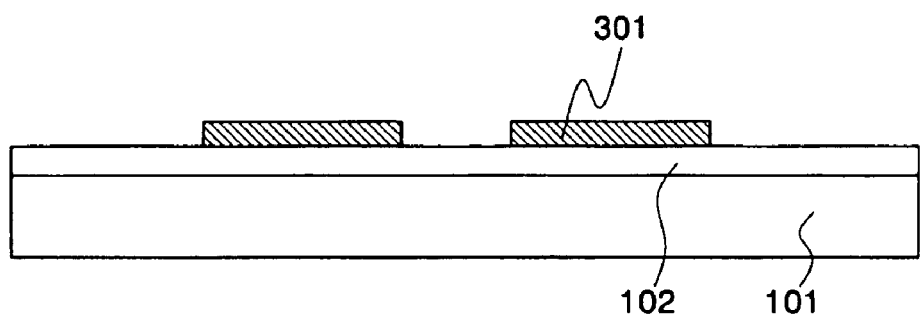
Figure 3C:
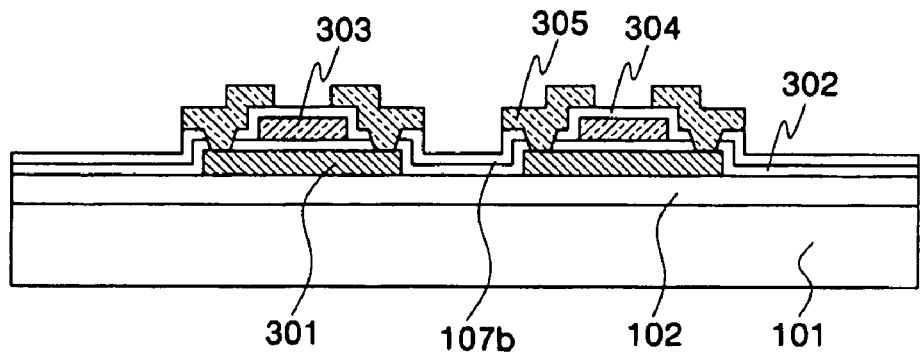

FIGS. 3a to 3c are cross-sectional views illustrating a second embodiment of a process of fabricating a TFT using the polysilicon layers crystallized according to the present invention.

FIG. 3a is a cross-sectional view illustrating a process of etching the metal silicide layer and the first polysilicon layer after heat-treating the substrate. As shown in FIG. 3a, the metal silicide layer is completely removed, and the first polysilicon layer formed on the second amorphous silicon layer region and the first amorphous silicon layer region are completely removed by using a wet- or dry-etching technique. At this time, if the wet- or dry-etching process is performed as an etching process having a selectivity to the diffusion barrier layer pattern and a straightness, the diffusion barrier layer pattern 104 and the second polysilicon layer 108 are not etched and remain.

At this time, the wet- or dry-etching process may be performed as an etching process having no selectivity to the diffusion barrier layer pattern. This is because the first polysilicon layer of the first amorphous silicon layer region and the second amorphous silicon layer region are etched faster than the first polysilicon layer of the second amorphous silicon layer region and the diffusion barrier layer pattern.

Then, 3b is a cross-sectional view illustrating a process of etching the diffusion barrier layer pattern to form a semiconductor layer. As shown in FIG. 3b, the diffusion barrier layer formed on the second polysilicon layer is completely removed by a wet- or dry-etching process to form a semiconductor layer 301 which is formed of only the second polysilicon layer of the first amorphous silicon layer region crystallized by the MILC technique. The semiconductor layer is formed of only the second polysilicon layer, and thus the metal silicide does not remain and it has excellent electrical characteristics. At this time, the wet- or dry-etching process may be performed as an etching process having both straightness and selectivity to the diffusion barrier layer pattern or as a process having only straightness but no selectivity to the diffusion barrier layer pattern. This is because the first polysilicon layer of the first amorphous silicon layer region and the second amorphous silicon layer region are etched faster than the first polysilicon layer of the second amorphous silicon layer region and the diffusion barrier layer pattern.

FIG. 3c is a cross-sectional view illustrating a process of sequentially forming a gate insulating layer, a gate electrode, an interlayer insulator, and source and drain electrodes on the substrate having the semiconductor layer. As shown in FIG. 3c, a gate insulating layer 302 of a single- or a multi-layer structure formed of a silicon oxide layer or a silicon nitride layer is formed on the substrate on which the semiconductor layer is formed. Then, a gate electrode material layer is deposited over the whole surface of the substrate and patterned into a gate electrode 303. An interlayer insulator 304 of a single- or multi-layer structure formed of a silicon oxide layer or a silicon nitride layer is formed over the whole surface of the substrate. The interlayer insulator and the gate insulating layer are etched to form contact holes which expose predetermined regions of the semiconductor layer. A source/drain electrode material layer is deposited over the whole surface of the substrate and patterned into source and drain electrodes 305, thereby completing a TFT.

At this time, after forming the gate electrode, an ion doping process may be further performed using the gate electrode as a mask to define a source/drain region and a channel area.

Figure 4A:
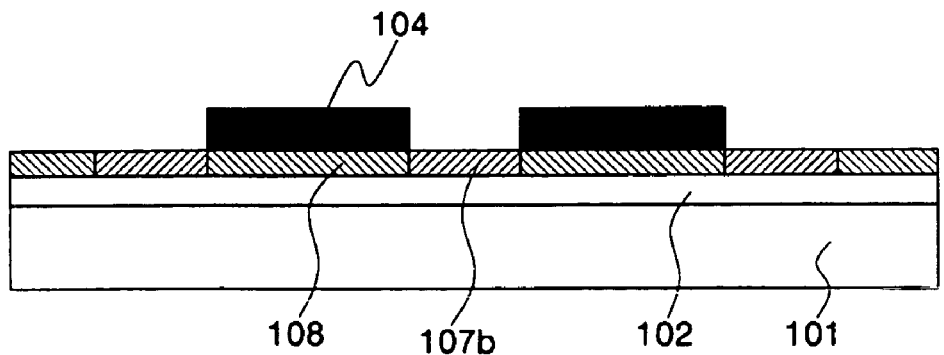
FIGS. 4a to 4c are cross-sectional views illustrating a third embodiment of a process of fabricating a TFT using the polysilicon layers crystallized according to the present invention.
Figure 4B:
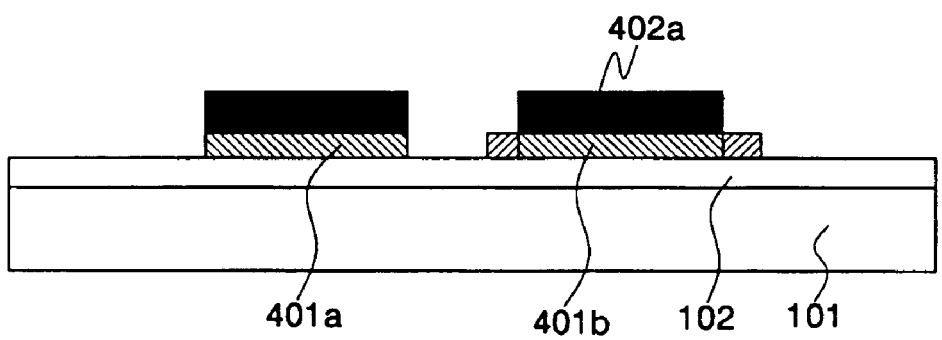
Figure 4C:
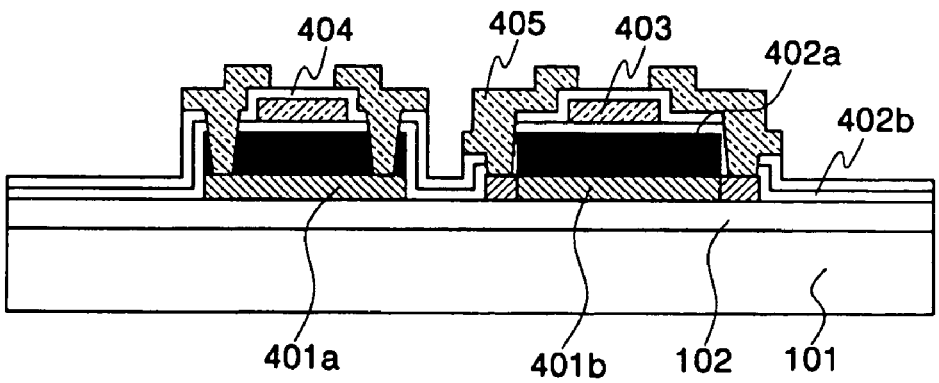

FIGS. 4a to 4c are cross-sectional views illustrating a third embodiment of a process of fabricating a TFT using the polysilicon layers crystallized according to the present invention.

FIG. 4a is a cross-sectional view illustrating a process of etching the metal silicide layer and the second amorphous silicon layer region after heat-treating the substrate. As shown in FIG. 4a, the metal silicide layer is completely removed, and the second amorphous silicon layer region which is crystallized into the first polysilicon layer is completely removed by using a wet- or dry-etching technique, whereby the first amorphous silicon layer region having the first polysilicon layer 107b and the second polysilicon layer 108 and the diffusion barrier layer pattern 104 remain.

FIG. 4b is a cross-sectional view illustrating a process of etching the first amorphous silicon layer region to form a semiconductor layer and a first gate insulating layer. As shown in FIG. 4b, the first amorphous silicon layer region is etched using the diffusion barrier layer pattern as a mask to form a semiconductor layer 401a which is formed of the second polysilicon layer 108 crystallized by the MILC technique, or the first amorphous silicon layer region is etched using a larger photoresist pattern than the diffusion barrier layer to form a semiconductor layer 401b which is formed of the first polysilicon layer 107b and the second polysilicon layer 108.

At this time, the diffusion barrier layer pattern may remain to act as a first gate insulating layer 402a.

FIG. 4c is a cross-sectional view illustrating a process of sequentially forming a second gate insulating layer, a gate electrode, an interlayer insulator, and source and drain electrodes on the substrate. As shown in FIG. 4c, a second gate insulating layer 402b of a single- or a multi-layer structure formed of a silicon oxide layer or a silicon nitride layer is formed on the substrate on which the semiconductor layer and the first gate insulating layer are formed. Then, a gate electrode material layer is deposited over the whole surface of the substrate and patterned into a gate electrode 403. An interlayer insulator 404 of a single- or multi-layer structure formed of a silicon oxide layer or a silicon nitride layer is formed over the whole surface of the substrate. The interlayer insulator and the gate insulating layers are etched to form contact holes which expose predetermined regions of the semiconductor layer. A source/drain electrode material layer is deposited over the whole surface of the substrate and patterned into source and drain electrodes 405, thereby completing a TFT.

At this time, after forming the gate electrode, an ion doping process may be further performed using the gate electrode as a mask to define a source/drain region and a channel area.

Figure 5A:
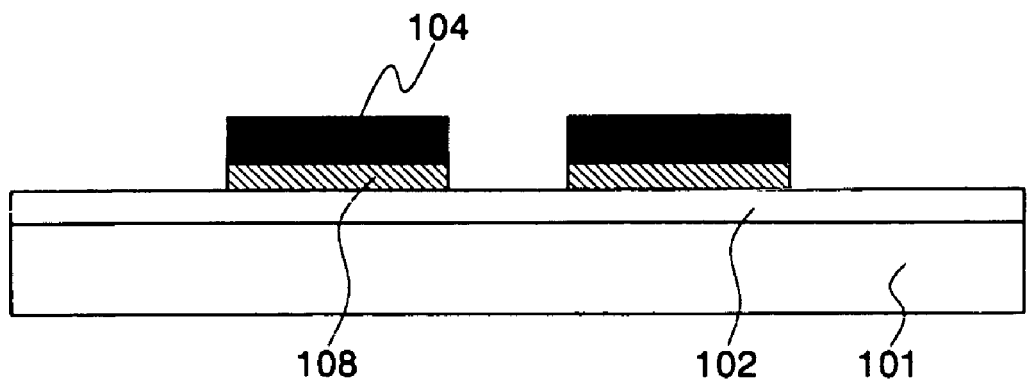
FIGS. 5a and 5b are cross-sectional views illustrating a fourth embodiment of a process of fabricating a TFT using the polysilicon layers crystallized according to the present invention.
Figure 5B:
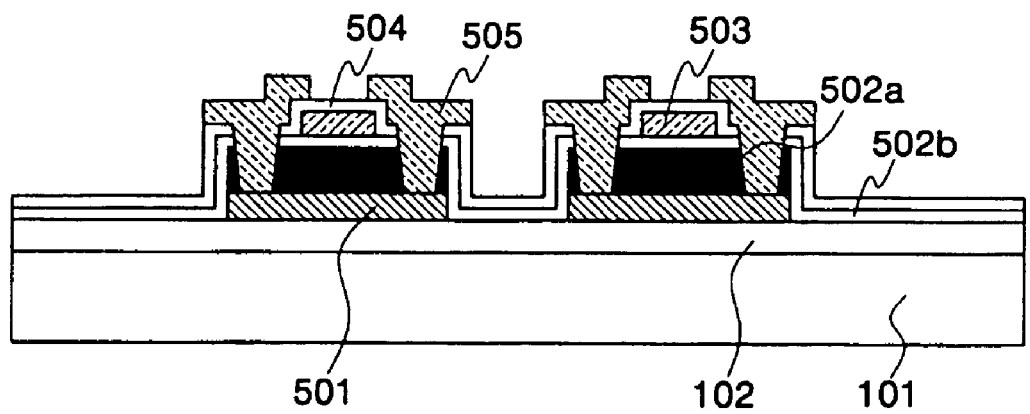

FIGS. 5a to 5b are cross-sectional views illustrating a fourth embodiment of a process of fabricating a TFT using the polysilicon layers crystallized according to the present invention.

FIG. 5a is a cross-sectional view illustrating a process of etching the metal silicide layer and the first polysilicon layer to form a first gate insulating layer and a semiconductor layer after heat-treating the substrate. As shown in FIG. 5a, the metal silicide layer and the first polysilicon layer which includes predetermined portions of the first and second amorphous silicon layers are completely removed using a wet- or dry-etching technique, so that the second polysilicon layer 108 of the first amorphous silicon layer region and the diffusion barrier layer pattern 104 remain on the substrate to be used as a semiconductor layer and a gate insulating layer. At this time, the wet- or dry-etching process is preferably performed as an etching process having a selectivity to the diffusion barrier layer pattern and straightness. This is because, unlike FIG. 3a, the diffusion barrier layer pattern is used as a gate insulating layer and thus if the diffusion barrier layer pattern gets damaged during the etching process characteristics of a gate insulating layer may be degraded.

FIG. 5b is a cross-sectional view illustrating a process of sequentially forming a second gate insulating layer, a gate electrode, an interlayer insulator, and source and drain electrodes on the substrate. As shown in FIG. 5b, a second gate insulating layer 502b of a single- or a multi-layer structure formed of a silicon oxide layer or a silicon nitride layer is formed on the semiconductor layer 501 comprised of only the second polysilicon layer crystallized by the MILC technique and a first gate insulating layer 502a which is the diffusion barrier layer pattern. Then, a gate electrode material layer is deposited over the whole surface of the substrate and patterned into a gate electrode 503. An interlayer insulator 504 of a single- or multi-layer structure formed of a silicon oxide layer or a silicon nitride layer is formed over the whole surface of the substrate. The interlayer insulator and the gate insulating layers are etched to form contact holes which expose predetermined regions of the semiconductor layer. A source/drain electrode material layer is deposited over the whole surface of the substrate and patterned into source and drain electrodes 505, thereby completing a TFT.

As described herein before, the method of fabricating the TFT according to the present invention controls regions to which the amorphous silicon layer is crystallized by the MIC technique or the MILC technique to minimize the density of the remaining metal silicide in the semiconductor layer, especially in the channel area. Therefore, there is an advantage in that a leakage current is minimized as is contamination due to contact between the photoresist pattern and the surface of the semiconductor layer.

What is claimed is:

1. A method of fabricating a thin film transistor, comprising:
   preparing an insulating substrate;
   forming a first amorphous silicon layer on the substrate;
   forming a diffusion barrier layer pattern on a portion of the first amorphous silicon layer;
   forming a second amorphous silicon layer over the diffusion barrier layer;
   forming a metal silicide layer on the second amorphous silicon layer; and
   heat-treating the substrate to crystallize the first and second amorphous silicon layers, wherein the heat-treating forms a first polysilicon layer on regions of the substrate where there is no diffusion barrier layer pattern and a second polysilicon layer on regions of the substrate covered by the diffusion barrier layer pattern.

2. The method of claim 1, further comprising, after heat-treating the substrate,
   etching the metal silicide layer and the crystallized second amorphous silicon layer covering the diffusion barrier layer pattern;
   removing the diffusion barrier layer pattern;
   patterning the first polysilicon layer and the second polysilicon layer to form a semiconductor layer; and
   sequentially forming a gate insulating layer, a gate electrode, an interlayer insulator, and source and drain electrodes over the semiconductor layer.

3. The method of claim 2, wherein the second polysilicon layer is crystallized by a MILC technique and the first polysilicon layer is crystallized by a MIC technique.

4. The method of claim 2, wherein a mask used to form the diffusion barrier layer pattern is identical to that used to form the semiconductor layer.

5. The method of claim 1, further comprising, after heat-treating the substrate;
   etching the metal silicide layer and the first polysilicon layer;
   etching the diffusion barrier layer pattern to form a semiconductor layer; and
   sequentially forming a gate insulating layer, a gate electrode, an interlayer insulator, and source and drain electrodes over the semiconductor layer.

6. The method of claim 5, wherein the second polysilicon layer is crystallized by a MILC technique.

7. The method of claim 1, further comprising, after heat-treating the substrate,
   etching the metal silicide layer and the crystallized second amorphous silicon layer covering the diffusion barrier layer pattern;
   patterning the first polysilicon layer and the second polysilicon layer to form a semiconductor layer and a first gate insulating layer; and
   sequentially forming a second gate insulating layer, a gate electrode, an interlayer insulator, and source and drain electrodes over the substrate.

8. The method of claim 7, wherein the first gate insulating layer is formed of the diffusion barrier layer pattern.

9. The method of claim 7, wherein the second polysilicon layer is crystallized by a MILC technique and the first polysilicon layer is crystallized by a MIC technique.

10. The method of claim 1, further comprising, after heat-treating the substrate,
    etching the metal silicide layer and the first polysilicon layer to form a first gate insulating layer and a semiconductor layer; and
    sequentially forming a second gate insulating layer, a gate electrode, an interlayer insulator, and source and drain electrodes over the substrate.

11. The method of claim 10, wherein the first gate insulating layer is formed of the diffusion barrier layer pattern.

12. The method of claim 10, wherein the second polysilicon layer is crystallized by a MILC technique.

13. The method of claim 1, wherein the first amorphous silicon layer has a thickness from 400 Å to 600 Å.

14. The method of claim 1, wherein the second amorphous silicon layer has a thickness from 500 Å to 1,500 Å.

15. The method of claim 1, wherein the heat-treatment process is performed at a temperature from 400° C. to 1,300° C.

16. The method of claim 1, wherein the heat-treatment process is performed at a temperature from 400° C. to 700° C.

17. The method of claim 1, wherein the metal silicide layer is formed of a compound of a silicon and a metal selected from the group consisting of Ni, Pd, Ti, Ag, Au, Al, Sn, Sb, Cu, Co, Mo, Cr, Ru, Rh, Cd, and Pt.

18. The method of claim 1, wherein the metal silicide layer is a nickel silicide layer.

19. The method of claim 1, wherein the diffusion barrier layer pattern is a silicon oxide layer or a silicon nitride layer and has a single-layer or multi-layer structure.

20. The method of claim 1, wherein the diffusion barrier layer pattern is a pattern for preventing the metal silicide layer or a crystallinity of the first polysilicon layer from being diffused or transferred into the second polysilicon layer below the diffusion barrier layer pattern.

* * * * *